(12) United States Patent
Mo et al.

(10) Patent No.: US 7,837,354 B2
(45) Date of Patent: Nov. 23, 2010

(54) METHOD FOR MOUNTING AN LED MODULE ON A SUPPORT

(75) Inventors: Ci-Jin Mo, Shenzhen (CN); You-Xue Liu, Shenzhen (CN); Qing-Hai Ruan, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 205 days.

(21) Appl. No.: 12/202,402

(22) Filed: Sep. 1, 2008

(65) Prior Publication Data

US 2010/0053962 A1    Mar. 4, 2010

(51) Int. Cl.
 *F21V 21/00* (2006.01)
(52) U.S. Cl. .................. 362/249.02; 362/374; 362/457
(58) Field of Classification Search ................................ 362/249.02–249.06, 800, 249.01, 362, 374, 362/382, 457
See application file for complete search history.

(56) References Cited

U.S. PATENT DOCUMENTS

| | | | | |
|---|---|---|---|---|
| 6,431,728 | B1 * | 8/2002 | Fredericks et al. | 362/244 |
| 7,284,881 | B2 * | 10/2007 | Kim et al. | 362/290 |
| 7,566,147 | B2 * | 7/2009 | Wilcox et al. | 362/249.02 |
| 7,597,516 | B2 * | 10/2009 | Bucciferro et al. | 411/187 |
| 2005/0231949 | A1 * | 10/2005 | Kim et al. | 362/249 |

* cited by examiner

*Primary Examiner*—Bao Q Truong
(74) *Attorney, Agent, or Firm*—Frank R. Niranjan

(57) ABSTRACT

A method for mounting an LED module on a support comprises providing an LED module comprising a printed circuit board and multiple LEDs mounted on the printed circuit board, a support and a plurality of fasteners, each fastener comprising a head, a pole extending downwardly from a bottom of the head, and a plurality of teeth protruding downwardly from the bottom of the head and surrounding the pole, extending the fasteners through the printed circuit board of the LED module into the support, rotating each fastener such that the teeth thereof scrape insulating layers off a metal substrate of the printed circuit board, whereby a top face of the substrate is exposed and in direct contact with the teeth of the fasteners.

19 Claims, 4 Drawing Sheets

METHOD FOR MOUNTING AN LED MODULE ON A SUPPORT

BACKGROUND OF THE INVENTION

1. Field of the Invention

The present invention relates to a light emitting diode (LED) module on a support, and more particularly to a method for mounting an LED module on a support which can effectively prevent static electricity accumulation on the LED module.

2. Description of Related Art

LEDs have been available since the early 1960's. Because of their relatively high light-emitting efficiency, LED usage has increased in popularity in a variety of applications, such as residential, traffic, commercial, and industrial settings. In such applications, for sufficient light output, a plurality of LED modules is incorporated in a housing which supports mounting of the LED modules thereon, and also as a heat sink dissipating heat generated by the LED modules to an atmosphere ambient. Generally, most conventional LED modules are silicon printed circuit boards with multiple LEDs fixed thereon.

Recently, there has been proposed an LED module substituting a metal printed circuit board for the conventional board, to improve heat dissipation therefrom, thereby allowing increased density of arrangement of the LEDs on the printed circuit board, thus enhancing overall light output per LED module. The metal printed circuit board requires electrical insulation from the LEDs, preventing electrical communication therebetween. Among the many attempts at insulating the metal printed circuit board from the LEDs, one example thereof sequentially forms a first insulating layer, an electrically conductive layer, and a second insulating layer on the metal printed circuit board. The first insulating layer insulates the metal printed circuit board from the electrically conductive layer, which is directly connected to electrode leads of the LEDs, supplying current thereto, the second insulating layer overlays the electrically conductive layer to prevent contact between the electrically conductive layer and other electrical terminals, which may disturb normal operation of the LEDs if in electrical connection with the electrically conductive layer. A plurality of screws with insulating washers sleeved thereon extends through the metal printed circuit board to thereby attach the LED modules to the housing.

When the LED module is tested under a high voltage value by a testing device for determining electrical parameters thereof, or after being utilized for a long period as a light source in an LED lamp, there arises a probability that static electricity may be unexpectedly generated on an external surface of the second insulating layer. Since the washers, often of electrically insulating plastic material, are present between the screws and the external surface of the second insulating layer, the external surface of the second insulating layer can be substantially insulated from the screws. The static electricity on the external surface of the second insulating layer cannot be evacuated by the screws to ground, but will remain and accumulate gradually. A significant electrostatic discharge (ESD) may therefore occur in the LED module when accumulated static electricity reaches a critical value, and current may flow into the LEDs from the electrostatic discharge, resulting in malfunction or damage to the LEDs.

What is needed, therefore, is a method for mounting an LED module on a support which can overcome the described limitations.

SUMMARY OF THE INVENTION

A method for mounting an LED module on a support comprises providing an LED module, a support and a plurality of fasteners, each comprising a head, a pole extending downwardly from a bottom of the head, and a plurality of teeth protruding downwardly from the bottom of the head and surrounding the pole, inserting the fasteners through a printed circuit board of the LED module into the support, rotating each fastener to cause the teeth thereof to scrape parts of insulating layers off a metal substrate of the printed circuit board, whereby a top face of the substrate is exposed and in direct contact with the teeth of the fastener. Accordingly, an electrically conducting pathway between a top face of the insulating layers and the top face of the substrate is formed via the fasteners, and electrostatic electricity generated on the top face of the insulating layers can flow to the support through the pathway. Therefore, malfunction or damage to the LEDs by electrostatic discharge is avoided.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
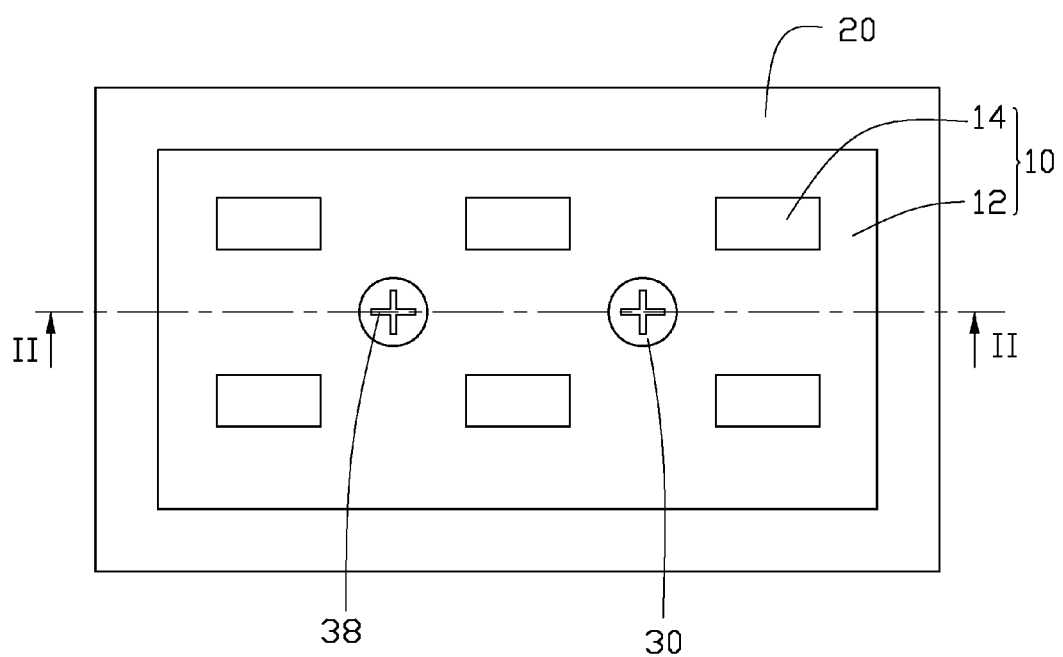
FIG. 1 is an assembled, top view of an LED module, two screws and a support fabricated by applying a method in accordance with an embodiment of the present invention.

FIG. 1 is a top view of an LED module 10 fixed on a support 20 via a pair of screws 30 according to an embodiment of a method to which the present invention is directed. The LED module 10 comprises a rectangular printed circuit board 12 and a plurality of LEDs 14 uniformly arranged thereon.

Figure 2:
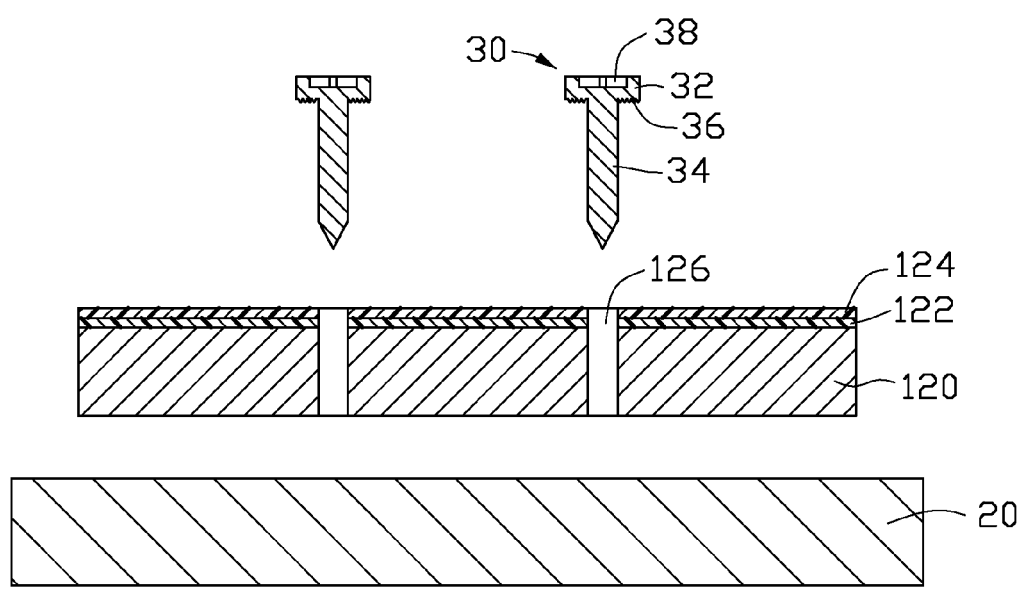
FIG. 2 is an exploded, cross-sectional view of FIG. 1 taking along line II-II, wherein the two screws being detached from the LED module.

Also referring to FIG. 2, the printed circuit board 12 constitutes a substrate 120 and a plurality of layers 122, 124 formed thereon. A pair of straight through holes 126 are defined through the printed circuit board 12 between the LEDs 14, accepting insertion of the screws 30 thereinto, thus engagingly attaching the LED module 10 on the support 20. The substrate 120 is substantially made of heat conducting material such as copper, aluminum or an alloy thereof. The plurality of layers 122, 124 comprises a first insulating layer 122, an electrically conductive layer (not shown), and a second insulating layer 124 sequentially plated on the substrate 120. A thickness of the substrate 120 is about 1.5 mm, and a total thickness of the three layers 122, 124 approximately 0.1 mm, exaggerated in FIGS. 2-4. The first insulating layer 122 covers an overall top face of the substrate 120, thereby completely insulating the electrically conductive layer from the substrate 120. The electrically conductive layer is patterned on the first insulating layer 122 according to positioning of the LEDs 14, avoiding the through holes 126. The electrically conductive layer directly connects electrode leads (not shown) of the LEDs 14, transferring current from a power source (not shown) thereto. The second insulating layer 124 is formed on an outermost side of the printed circuit board 12, preventing the electrically conductive layer from coming in contact with other electrical terminals (not shown). Since no electrically conductive layer is disposed adjacent to the through holes 126, the second insulating layer 124 directly joins the first insulating layer 122 in these locations as shown in FIGS. 2-4.

Each screw 30 is integrally of metal, consisting of a head 32 and a pole 34 extending downwardly from a bottom face thereof. The head 32 has a portion recessed downwardly in a top face thereof, to thereby define two crossed slots 38 (as viewed in FIG. 1). A plurality of teeth 36 protrudes downwardly from the bottom face of the head 32 and surrounds a top end of the pole 34. Each tooth 36 is triangular with a relatively sharp extremity end providing scraping capability if required. A plurality of spiral threads (not shown) around a circumferential face of the pole 34 for engaging internal threads in holes (not shown) in the support 20, thus interferingly securing the LED module 10 onto the support 20.

Figure 3:
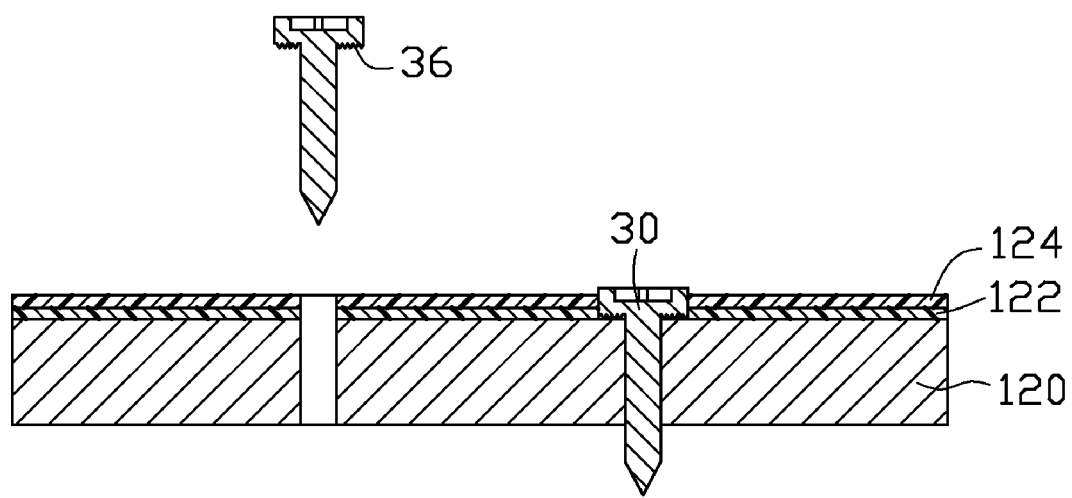
FIG. 3 is a view similar to FIG. 2, but one of the two screws being screwed into the LED module and the support being removed.
Figure 4:
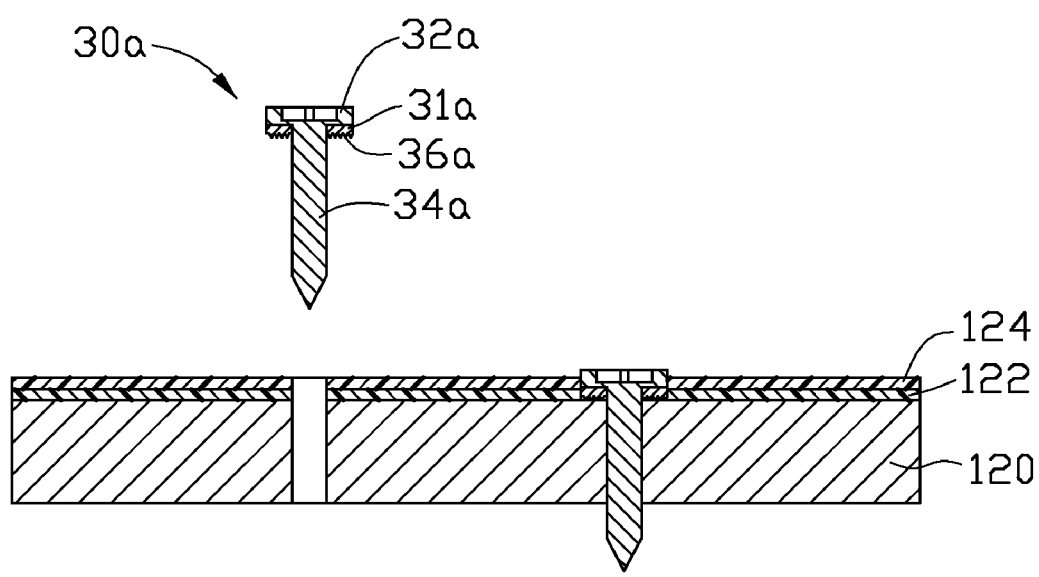
FIG. 4 is a view similar to FIG. 3, but configurations of the two screws being varied.

Also with reference to FIG. 3, during mounting of the LED module 10 onto the support 20, the screws 30 are prepared for ready insertion through the through holes 126 in the printed circuit board 12 with the teeth 36 thereof abutting a top face of the second insulating layer 124 of the printed circuit board 12. As rotation of each screw 30 generates downward progress toward the support 20, the teeth 36 of the screws 30 scrape annular areas of the second insulating layer 124 and the first insulating layer 122 of the printed circuit board 12 surrounding each through hole 126. Until the teeth 36 reach the top face of the substrate 120, an annular part of the top face of the substrate 120 surrounding each through hole 126 is substantially exposed. Meanwhile, rigidity of the substrate 120 prevents the ends of the teeth 36 from penetrating deeply into the substrate 120, and the screws 30 are impeded from further downward motion. At this time, the heads 32 of the screws 30 project out of the second insulating layer 124 to establish electrical connection with the top face of the second insulating layer 124, and the poles 34 of the screws 30 are threaded in the support 20, firmly attaching the LED module 10 to the support 20.

As a result of the removal of annular areas of the first insulating layer 122 and the second insulating layer 124 near the screws 30 from the substrate 120, the head 32 of the screw 30 can directly contact the substrate 120 and make electrical connection with the top face of the second insulating layer 124 of the printed circuit board 12. Static electricity generated on the top face of the second insulating layer 124 is conducted via the screws 30 to the substrate 120 which has been grounded beforehand, such that malfunction of or damage to the LEDs 14 due to electrostatic discharge is avoided.

Further, to ensure that the annular areas of the first and second insulating layers 122, 124 surrounding the through holes 126 can be completely cleared, the screws 30 can be continuously rotated and thereby impelled downward to scrape a top portion of the substrate 120 under a large force, after engaging the top face of the substrate 120. Thickness of material scraped off the substrate 120 is commensurate with the force available, preferably, in the present embodiment, such thickness is about 0.2 mm.

Alternatively, the screws 30 can be replaced by other elements as long as the same function is accomplished. One among such elements is shown in FIG. 4, which shows a fastening assembly 30a replacing the prior integrally formed screw 30. The fastening assembly 30a comprises a screw (not labeled) which has a head 32a, a pole 34a extending downwardly from a bottom face of the head 32a, and a metal annulus 31a detachably sleeved on the pole 34a of the screw. The annulus 31a has a circumference coincidental with that of the head 32a of the screw. A plurality of teeth 36a projects downwardly from the bottom face of the annulus 31a. The teeth 36a are set to perform the same function as the teeth 36 of the original screws 30, i.e., scraping annular areas of the first and second insulating layers 122, 124 off the substrate 120 of the printed circuit board 12. Note that the screw and the annulus 31a of the fastening assembly 30a actually equal two corresponding separated parts of the prior screw 30, respectively.

The above described processes of mounting the LED module 10 on the support 20 can also be summarized as providing a support 20, an LED module 10 having a printed circuit board 12 and a plurality of LEDs 14 mounted on the printed circuit board 12, and two screws/fastening assemblies 30, 30a with teeth 36, 36a formed therefrom, extending the screws/fastening assemblies 30, 30a through the printed circuit board 12 of the LED module 10 and into the support 20, screwing the screws/fastening assemblies 30, 30a toward the support 20 to cause the teeth 36, 36a of the screws/fastening assemblies 30, 30a to scrape annular areas of insulating layers 122, 124 of the printed circuit board 12 of the LED module 10 until a metal substrate 120 of the printed circuit board 12 is exposed, and continuing screwing the screws/fastening assemblies 30, 30a to scrapingly remove a top portion of the metal substrate 120 having a thickness of about 0.2 mm.

In addition, the present invention further provides another method for mounting the LED module 10 on the support 20 which can equally ensure prevention of electrostatic accumulation on the LED module 10, comprising providing a support 20, an LED module 10 having a printed circuit board 12 and a plurality of LEDs 14 mounted on the printed circuit board 12, and a plurality of screws/fastening assemblies 30, 30a, milling portions of the printed circuit board 12 in areas surrounding through holes 126 thereof to thereby expose a top face of a metal substrate 120; and extending the screws/fastening assemblies 30, 30a through the through holes 126 of the printed circuit board 12 and into the support 20 to bring heads 32, 32a of the screws/fastening assemblies 30, 30a into physical contact with the top face of the metal substrate 120.

It is to be noted that the screws/fastening assemblies 30, 30a used in the latter method eliminate the need for formation of teeth 36, 36a thereon, since the printed circuit board 12 has been previously milled to expose the top face of the metal substrate 120, such that removal of the first and second insulating layers 122, 124 of the printed circuit board 12 by scraping the printed circuit board 12 with the toothed screws/fastening assemblies 30, 30a is accordingly omitted. As well, conventional screws can be used in this method. As before, a top portion with a thickness of about 0.2 mm is removed, albeit in this case by prior milling.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for mounting an LED module on a support, comprising
   1) providing an LED module having a printed circuit board and a plurality of LEDs mounted thereon, a support, and an electrically conductive fastener, the printed circuit board having a metal substrate and an insulating layer formed on a top face of the substrate;
   2) removing a corresponding part of the insulating layer from the substrate to expose the top face of the substrate; and
   3) extending the fastener through the printed circuit board into the support, wherein an end of the fastener establishes electrical communication with a top face of the insulating layer and the top face of the substrate, static electricity generated on the top face of the insulating layer being conducted via the fastener to the substrate which has been grounded beforehand.

2. The method for mounting an LED module on a support as claimed in claim 1, wherein step 2) is implemented by milling the corresponding part of the insulating layer off the substrate.

3. The method for mounting an LED module on a support as claimed in claim 1, wherein step 2) is simultaneously implemented with step 3) by scraping the corresponding part of the insulating layer off the substrate with the fastener when the fastener is extended through the printed circuit board into the support.

4. The method for mounting an LED module on a support as claimed in claim 3, wherein the fastener comprises a head, a pole extending downwardly from the head, and a plurality of teeth protruding downwardly toward the support, the plurality of teeth scraping the corresponding part of the insulating layer from the substrate in step 2).

5. The method for mounting an LED module on a support as claimed in claim 4 further comprising step 4) continuously scraping the substrate with the plurality of teeth of the fastener after step 3).

6. The method for mounting an LED module on a support as claimed in claim 5, wherein a substrate portion scraped off by the plurality of teeth of the fastener has a thickness of 0.2 mm.

7. The method for mounting an LED module on a support as claimed in claim 4, wherein the fastener is made integrally.

8. The method for mounting an LED module on a support as claimed in claim 4, wherein the fastener comprises a screw and an annulus detachably sleeved on the screw, the head and the pole together constituting the screw, and the teeth being formed from the annulus.

9. The method for mounting an LED module on a support as claimed in claim 4, wherein each of the plurality of teeth is triangular.

10. The method for mounting an LED module on a support as claimed in claim 1, wherein a through hole is defined through the printed circuit board, the corresponding removed part of the insulating layer being annular and surrounding the through hole.

11. A method for mounting an LED module on a support, comprising
    1) providing an LED module comprising a printed circuit board and a plurality of LEDs mounted on the printed circuit board, the printed circuit board comprising a metal substrate and an insulating layer formed on a top face of the substrate;
    2) providing a support which is grounded;
    3) providing a plurality of electrically conductive fasteners each comprising a head, a pole extending downwardly from a bottom of the head, and a plurality of teeth extending downwardly and surrounding the pole;
    4) extending the plurality of fasteners through the printed circuit board and into the support; and
    5) rotating the plurality of fasteners such that the plurality of teeth thereof scrape portions of the insulating layer off the top face of the substrate of the printed circuit board, whereby the plurality of fasteners electrically connects with a top face of the remaining insulating layer and the top face of the substrate , static electricity generated on the top face of the remaining insulating layer being conducted via the fasteners to the substrate which has been grounded beforehand.

12. The method for mounting an LED module on a support as claimed in claim 11, wherein the plurality of teeth continues to scrape the top face of the substrate after step 5) to reach a lower level 0.2 mm from the top face of the substrate of the printed circuit board.

13. The method for mounting an LED module on a support as claimed in claim 11, wherein each of the plurality of fasteners is made integrally.

14. The method for mounting an LED module on a support as claimed in claim 11, wherein each of the plurality of fasteners comprises two mutually detachable parts, one comprising the head and the pole, and the other comprising a ring and the plurality of teeth formed from the ring.

15. The method for mounting an LED module on a support as claimed in claim 11, wherein each of the plurality of teeth has a sharp extremity end projecting toward the support.

16. The method for mounting an LED module on a support as claimed in claim 1, wherein the insulating layer has a thickness less than 0.1 mm.

17. The method for mounting an LED module on a support as claimed in claim 11, wherein the insulating layer has a thickness less than 0.1 mm.

18. The method for mounting an LED module on a support as claimed in claim 1, wherein the printed circuit board further comprises another insulating layer below the insulating layer and an electrically conductive layer between the insulating layer and the another insulating layer.

19. The method for mounting an LED module on a support as claimed in claim 11, wherein the printed circuit board further comprises another insulating layer below the insulating layer and an electrically conductive layer between the insulating layer and the another insulating layer.

* * * * *